(12) United States Patent
Lombardo et al.

(10) Patent No.: US 7,201,647 B2
(45) Date of Patent: Apr. 10, 2007

(54) SUBPAD HAVING ROBUST, SEALED EDGES

(75) Inventors: Brian Lombardo, Amherst, NH (US); Joseph Cianciolo, Methuen, MA (US)

(73) Assignee: Praxair Technology, Inc., Danbury, CT (US)

( * ) Notice: Subject to any disclaimer, the term of this patent is extended or adjusted under 35 U.S.C. 154(b) by 492 days.

(21) Appl. No.: 10/273,194

(22) Filed: Oct. 16, 2002

(65) Prior Publication Data

US 2003/0228836 A1    Dec. 11, 2003

Related U.S. Application Data

(60) Provisional application No. 60/386,943, filed on Jun. 7, 2002.

(51) Int. Cl.
*B24D 11/00*    (2006.01)

(52) U.S. Cl. ............... 451/526; 451/530; 451/533; 451/296

(58) Field of Classification Search ............ 451/41, 451/285, 287, 288, 526, 530, 533, 539, 296–307
See application file for complete search history.

(56) References Cited

U.S. PATENT DOCUMENTS

| | | | | |
|---|---|---|---|---|
| 6,123,609 | A | 9/2000 | Satou | 451/285 |
| 6,126,532 | A * | 10/2000 | Sevilla et al. | 451/526 |
| 6,368,197 | B2 * | 4/2002 | Elledge | 451/296 |
| 6,413,873 | B1 * | 7/2002 | Li et al. | 438/711 |
| 6,439,968 | B1 | 8/2002 | Obeng | 451/41 |
| 6,464,576 | B1 * | 10/2002 | Freeman et al. | 451/533 |
| 6,485,359 | B1 * | 11/2002 | Li et al. | 451/289 |
| 6,491,570 | B1 * | 12/2002 | Sommer et al. | 451/41 |
| 6,561,889 | B1 * | 5/2003 | Xu et al. | 451/526 |
| 6,613,200 | B2 * | 9/2003 | Li et al. | 204/198 |
| 6,733,373 | B1 * | 5/2004 | Yang et al. | 451/296 |

FOREIGN PATENT DOCUMENTS

| WO | WO 01/15864 A1 | 8/2000 |
|---|---|---|
| WO | WO 01/83167 A1 | 5/2001 |

* cited by examiner

*Primary Examiner*—Eileen P. Morgan
(74) *Attorney, Agent, or Firm*—Iurie A. Schwartz

(57) ABSTRACT

Provided are encapsulated belts and encapsulated pads for use in a variety of polishing application, including the chemical-mechanical polishing and planarization of semiconductor wafers and other workpieces. The encapsulated belts and pads are characterized by a robust seal between a polishing layer of the pad or belt and the edges of the subpad layer of the pad or belt. The robust seal is accomplished by casting a polymer directly over the subpad layer. The edges of the subpad layer may include one or more functional features that promote the formation of a watertight and slurry-resistant seal when the subpad layer is covered with a cast polymer. Also provided is a method of producing a robust seal between the polishing layer and the edge region of the subpad by encapsulating a subpad layer with a polymeric material.

54 Claims, 5 Drawing Sheets

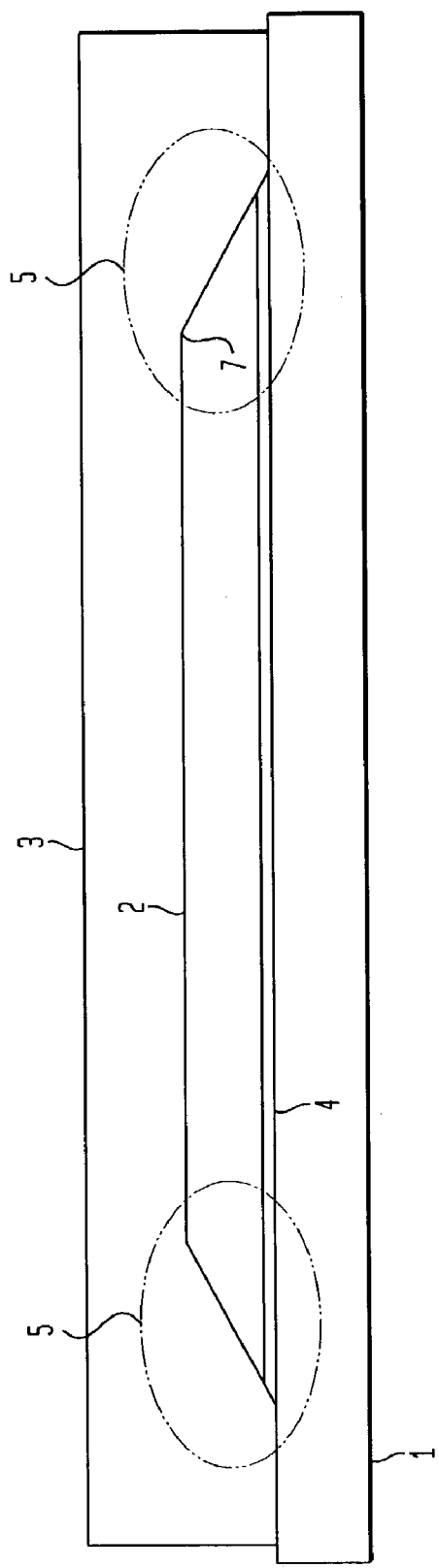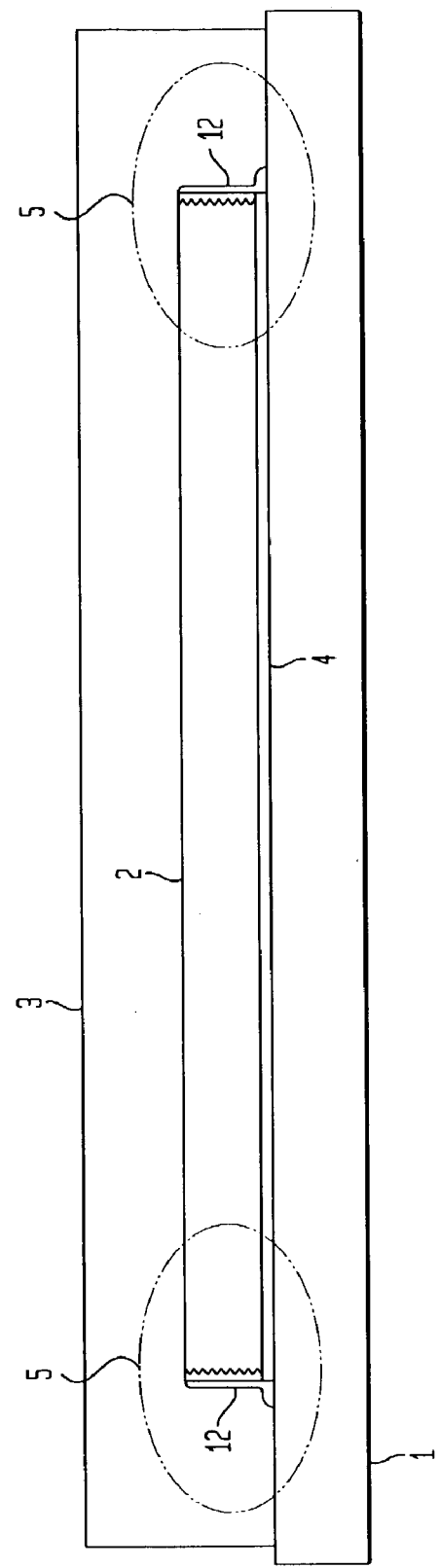

SUBPAD HAVING ROBUST, SEALED EDGES

CROSS REFERENCE TO RELATED APPLICATION

This application claims priority to U.S. Provisional Application No. 60/386,943, filed Jun. 7, 2002.

BACKGROUND OF THE INVENTION

1. Field of the Invention

The present invention relates to improved sealing of subpad edges used for a variety of applications, including semiconductor polishing.

2. Background of the Invention

Silicon wafers are produced as precursors from which microelectronic semiconductor components are produced. The wafers are cut from cylindrical silicon crystals, parallel to their major surfaces, to produce thin disks, typically 20–30 cm in diameter, although larger or smaller wafers are possible. The resulting wafers must be polished to give flat and planar surfaces for deposition of electronic components onto the surface by standard lithographic and etching techniques to form integrated chip semiconductor devices. Typically a 20–cm diameter wafer will produce about 100 or more microprocessor chips.

The designed size of such integrated chips is steadily decreasing, while the number of layers applied, e.g. by lithography onto the silicon surface, is rising to produce ever smaller and increasingly complex microcircuits. Present semiconductors typically incorporate 8 or more metal layers, and it is expected that future designs will contain even more layers. The decrease in the size of circuitry and the increase in the number of layers applied are leading to ever more stringent requirements on the smoothness and planarity of the silicon and semiconductor wafers throughout the chip manufacturing process, since uneven surfaces ultimately result in imperfections and defects leading to unplanned resistances where a conductor is narrowed, to capacitances/nonconductive gaps where breaks occur in deposited conductor layers, and to unplanned short circuits where insulating barriers are breached, which interfere with or compromise the planned operation of the circuit.

In the semiconductor chip fabrication process, it is well-known that there is a need to polish a semiconductor wafer. This polishing is typically accomplished by a chemical mechanical (CMP) process. One standard CMP wafer polishing technique is to remove a wafer from a stack, or cassette of e.g. 25 wafers, by means of a robotic arm, and maneuver the wafer into position over a rotating flat polishing pad mounting on a large turntable. An overhead wafer carrier maintains the wafer in place while being polished by a rotating pad and a chemical-mechanical polishing slurry applied to the surface of the pad. The slurry is generally made up of an aqueous solution with metallic or non-metallic particles such as, for example, aluminum or silica abrasives that create added friction for the polishing process. The polishing pad is usually made of polyurethane. This is an adaptation of optical polishing technology used for polishing lenses, mirrors, and other optical components. Once polishing is completed, the robot arm removes the wafer and transfers it to another workstation for eventual lithographic deposition and etch steps.

A significantly different approach is the so-called Linear Planarization Technology (LPT), wherein a traveling belt is used to polish the wafer, in place of the rotating flat turntable form of polishing tool. The belt used in this method is described in EP-A-0696495 and comprises a belt of sheet steel or other high strength material, having a conventional flat polyurethane polishing pad affixed to it with adhesive. As with the rotating pad, the pad used for LPT CMP polishing receives a chemical-mechanical polishing slurry that is distributed over the surface of the belt.

The polishing pads, discussed above, are often stacked onto compressible subpads in order to increase the ability of the pad to conform to the wafer surface during polishing. Unlike the polishing layers of the pads or belts, the subpads are typically liquid absorbent. And when liquid (e.g., the CMP slurry) soaks into the subpad, the subpad's physical properties change, which in turn changes or impairs the polishing performance of the polishing layer stacked onto the subpad.

One common way that liquid (e.g., the CMP slurry) can contact, and thereby soak into, the subpad is through the edges of the subpad. These edges include the edges around the outer periphery of the subpad as well as the edges of an internal aperture in the subpad, such as is used for endpoint detection.

Attempts to inhibit liquid absorption into the subpad edges were made in WO 01/15864 (Freeman et al.), where the edges of the subpad were heat sealed, pressure embossed, or coated with a waterproof substance such as silicone rubber. In U.S. Pat. No. 6,123,609 (Satou), the subpad surface and edges were completely covered with a polishing web, which was attached directly to the rotating turntable with waterproof tape.

Those strategies, while helpful, are not without their disadvantages and drawbacks. One significant drawback is that the seals and/or adhesives used in these strategies are exposed to attack by the CMP slurry, which can degrade the seals and/or delaminate the polishing layers. Another disadvantage is that the belt or pad user must perform the sealing operation at the site of use, rather than having the belt manufacturer preseal the subpad edges. Finally, the edge sealing of the prior art is unsuitable for continuous polishing belts which subject the edge seals to pronounced stretching and bending forces as the belt is pulled around the spinning rollers. The excessive bending and stretching compounded with the high stresses and rotational speed of the belts often lead to cracks and fractures in the edge sealant through which the CMP slurry may enter the subpad.

OBJECTS OF THE INVENTION

An object of the present invention is to provide a belt or pad with treated edges that prevents slurry or liquids from entering the edges of the subpad of the belt or pad.

An object of the present invention is to provide a belt and pad with an improved seal between the edges of the subpad and the polishing layer so as to prevent slurry or liquids from coming into contact with the edges of the subpad. It is a further object of the invention to provide an improved seal between the edges of the subpad and the polishing layer that is able to maintain its integrity during extreme temperatures, pressures and stresses.

An object of the invention is to provide a polishing belt or pad with robust sealing of the edges of the subpad so as to prevent a slurry from penetrating said subpad.

An object of the invention is to provide a belt or pad that prevents slurry or liquids from coming into contact with the edges of the subpad of the belt or pad while overcoming the expense and burden to the end user associated with polishing belts or pads of the prior art.

An object of the present invention is to provide belts and pads having encapsulated subpads, seamless polishing surfaces, and little, if any, exposed sealing materials or adhesives, wherein the belts and pads can be used for polishing silicon and semiconductor wafers, and wherein the problem of slurry soaking into the subpad layer is substantially overcome.

SUMMARY OF THE INVENTION

The present invention is directed to a belt or pad which overcomes the problem of slurry soaking into the subpad layer of the belt or pad by way of the subpad's edges, without the disadvantages of prior art belts and pads. In general, the present invention provides a resilient, robust edge seal between the edges of the subpad and the polishing layer of the pad to prevent slurry or liquids from contacting and penetrating the edges of the subpad. It should be appreciated that the present invention can be implemented in numerous ways, including as an apparatus, a process or method, a system or a device. Several inventive embodiments of the present invention are described below.

It should be noted at this point that the term "pad," as used herein, refers to disks, belts and any other geometric shape. As a result, the term "pad" may be used interchangeably with the term "belt" or "disk." Moreover, the term "disk" refers generally to any polishing pad that is used on a rotating, moving or stationary platen, regardless of the pad's shape. In other words, even though most pads used on rotating platens are in fact disk-shaped, the term "disk," as used herein, is not confined to that shape.

In one embodiment, the polishing pad has a polishing surface or layer for polishing a wafer or other workpiece. The polishing surface is composed of a polymeric material. The polishing surface of the polishing pad encapsulates a compressible subpad in order to increase the ability of the pad to conform to the wafer surface during polishing. The polishing layer is cast directly over the subpad, including the edges of the subpad, thereby saturating the edges of the subpad to effectively seal the edges of the subpad.

In another embodiment, the polishing pad has a polishing surface for polishing a wafer or other workpiece. The polishing surface is composed of a polymeric material. The polishing surface of the polishing pad encapsulates a compressible subpad which increases the ability of the pad to conform to the wafer surface during polishing. The edges of the subpad are trimmed prior to casting the polishing layer over the subpad so that the thickness of the subpad is reduced at the edges, to allow the polishing layer to completely penetrate and saturate the edges of the subpad.

In yet another embodiment, the polishing pad has a polishing surface for polishing a wafer or other workpiece. The polishing surface is composed of a polymeric material. The polishing surface of the polishing pad encapsulates a compressible subpad which increases the ability of the pad to conform to the wafer surface during polishing. The edges of the subpad are coated with a sealant or adhesive prior to casting the polishing layer over the subpad so that the sealant or adhesive gets absorbed into the edges of the subpad over a wide region. The subpad edges containing the sealant or adhesive form a strong bond with the polishing layer, thereby providing an improved seal between the edges of the subpad and the polishing layer that is resistant to extreme temperatures, pressures and stresses that are associated with CMP polishing.

In another embodiment, the polishing pad has a polishing surface for polishing a wafer or other workpiece. The polishing surface is composed of a polymeric material. The polishing surface of the polishing pad encapsulates a compressible subpad which increases the ability of the pad to conform to the wafer surface during polishing. The subpad edges are heat sealed prior to casting the polishing layer directly over the subpad to provide an improved seal impervious to slurry or other external components.

In another embodiment, the polishing pad has a polishing surface for polishing a wafer or other workpiece. The polishing surface is composed of a polymeric material. The polishing surface of the polishing pad encapsulates a compressible subpad which increases the ability of the pad to conform to the wafer surface during polishing. A trench is created some distance from the edge of the subpad creating multiple barriers at the edge of the subpad. The polishing layer is cast over the subpad and trench to create an effective seal with multiple barriers to prevent the chemical slurry from entering the subpad through the edges of the subpad. In an alternative embodiment, a separate strip of material may be placed some distance from the edge of the subpad to create multiple barriers.

The advantages of the present invention are numerous. Most notably, by creating a more robust seal between the subpad edge and polishing layer, whether it be by trimming the thickness of the subpad, applying a sealant or adhesive, heat sealing, or creation of multiple barriers prior to casting the polishing layer, or a combination of all of the above, slurry contact and absorption into the subpad via the subpad edges is prevented. The seal is robust, so it will last for the lifetime of the pad while providing stable performance throughout the pad's lifetime, even when the pad is subjected to excessive bending or stretching. This in turn results in economies of time and reduces the cost of the pad over its lifetime by eliminating the need to reseal the subpad edges or completely replace the subpad altogether. In addition, sealing the subpad at the time of manufacture in a consistent and robust manner eliminates the burden on the end user, who often lacks the facilities or equipment to effectively seal the pad in an efficient manner.

Other aspects and advantages of the invention will become apparent from the following detailed description, taken in conjunction with the accompanying drawings, illustrating by way of example the principle of the invention.

BRIEF DESCRIPTION OF THE DRAWINGS

The present invention will be readily understood by the following detailed description in conjunction with the accompanying drawings. To facilitate this description, like reference numerals designate like structural elements.

In FIG. 2, the polishing layer completely penetrates and saturates the reduced edge regions of the subpad.

FIG. 3 is a cross sectional view of another embodiment of the present invention in which the edges of the subpad are cut at an angle prior to casting the polishing layer directly over the edges of the subpad.

FIG. 4 is a cross sectional view of another embodiment of the present invention whereby the subpad edges contain a sealant or adhesive to form a strong bond with the polishing layer that is cast directly over the edges of the subpad.

DESCRIPTION OF EXEMPLIFIED EMBODIMENTS

The pads according to this invention can be used to polish any type of material or layer in any of various polishing steps, such as, for example, in semiconductor manufacturing. Typical materials to be polished include but are not limited to silicon, silicon dioxide, copper, tungsten, and aluminum. The polishing pad may be designed to selectively polish some materials and not others, to polish dissimilar materials at similar rates, or to work specifically with certain specific types of slurries and solutions. Although the pads of the present invention are especially suited for the chemical-mechanical polishing of electronic workpieces, such as silicon and semiconductor wafers, hard discs etc, the pads and belts of the present invention may also be used to polish other substrates, for example for polishing and planarizing optical flats and mirrors. In addition, the pad of the present may be applicable in other industries such as the pharmaceutical, chemical, and food industries.

Figure 1:
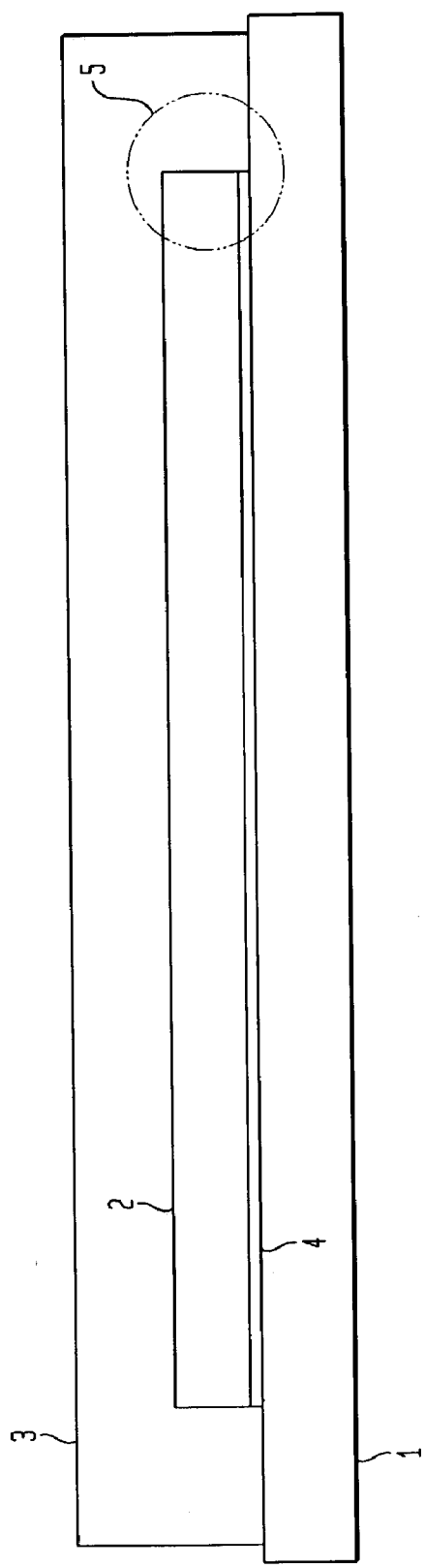
FIG. 1 is a cross sectional view of an embodiment of the present invention in which the polishing layer is cast directly over the edges of the subpad.

FIG. 1 is a cross sectional depiction of the pad of the present invention. The pad includes a substrate 1 that serves as a support material, which in the case of the present embodiment is a stainless steel belt or belt made of other material (e.g., plastics, elastomers, etc.) with suitable mechanical strength or properties. The pad also includes a subpad layer 2, which is preferably compressible, and is attached to substrate 1 by means of an optional adhesive layer 4. Any suitable adhesive may be used to bond the subpad layer 2 to the optional substrate 1, such as a pressure sensitive adhesive. For example, UHA 8791 sold by Avery Dennison Corporation (Pasadena, Calif.) may be used to adhere subpad 2 to substrate 1. By way of example, many commercially available subpads are equipped with a suitable adhesive backing, such as the 817 subpad material from Thomas West, Inc. (Sunnyvale, Calif.). Finally, the polishing pad of the present embodiment includes a polishing layer 3, comprising a polymer cast directly onto the subpad layer 2.

Turning now to the substrate 1, because substrate 1, in operation, contacts the mechanical rollers that turn the belt, it is preferred that substrate 1 comprise a durable material such as stainless steel or other suitable material, with stainless steel being especially preferred. For example, substrate 1 may comprise a woven metal mesh or perforate metal sheet, and the belt interstices maybe occupied by rivets or fillers of polymeric material to improve the bond strength between the polishing layer 3 and the substrate 1. The substrate 1 may be fully encapsulated by a polymer to avoid potential contamination or damage of the wafer during polishing. It should be noted that substrate 1 may itself comprise multiple layers.

Substrate 1 is typically 1.5–4 meters in length (often between 1.5 and 3 meters), measured as the inner circumference of the belt loop, 0.1–1.0 meters in width (often 0.2–0.6 meters), and 0.005–0.100 inches thick (with 0.010–0.030 inches being most preferred). An additional layer of protective material, such as a polyethylene liner material, can be affixed to the inside surface of substrate 1, to protect substrate 1 and the hardware of the polishing apparatus.

The subpad layer 2 may comprise any suitable material. Preferably, it comprises a compressible material that increases the ability of the pad to conform to the wafer surface during polishing. Suitable materials for subpad layer 2 are well known in the art, and include polymer foams and nonwoven materials made of any type of fiber, with or without fillers and impregnants. Subpad materials are typically compressible or exhibit relatively low hardness measurements (those falling within the Shore A hardness scale). Preferably, subpad layer 2 comprises a non-woven material, such as non-woven synthetic and natural fibers, including polyesters, polyamides, polyurethanes, polyolefins, fluoropolymers, cotton, wool, and combinations thereof. By way of example, a material suitable for use as subpad layer 2 is sold under the trade name SUBA IV™ by Rodel, Inc. (Newark, Del.). Subpads having a textured, rather than smooth, surface topography may be used to maximize mechanical locking interactions. For example, the outer layer of the subpad, including the subpad edges, may include exposed fibers which increase the mechanical bonding between the subpad and polishing layer that is cast over the subpad. Alternatively or additionally, the surface of the subpad may be modified (e.g., by buffing, molding, embossing, cutting, scoring, etc.) to add texture that facilitates increased bonding.

The typical dimensions of subpad layer 2, which may be one continuous piece or a combination of discontinuous segments, are shown in FIG. 1 in relative terms compared to the other elements of the belt. The width of subpad layer 2 is typically less than the width of substrate 1. In other words, in a typical arrangement, when subpad layer 2 is above substrate 1, a portion of substrate 1 extends beyond the perimeter boundaries of subpad layer 2. Since the pad of FIG. 1 is a continuous loop in the lengthwise direction, the length of subpad layer 2 (measured by its inner circumference) is substantially equal to the length of substrate 1 (measured by its outer circumference). As is also shown in FIG. 1, the vertical edges of the subpad layer 2 are typically orthogonal to the horizontal surfaces of the subpad. Although that shape is not necessary, nor particularly preferred, such subpads are commercially available and simple to use.

The polishing layer 3 comprises a mixture of one or more polymers cast over subpad layer 2. The polymer mixture preferably comprises polyurethane. The polishing layer can be solid or contains voids. Voids can be created by and suitable methods, such as by use of hollow microelements, by various foaming methods, or by sintering particles to form the polishing layer. Top layers can have any desired hardness. Different hardnesses are used to achieve different polishing performance and in different polishing applications. Commonly used top layers have hardness in the Shore D range. Most commonly in the 45–85 D range. More commonly in the 50–75D range. However, any thermosettable polymer material could be used including, but not limited to, a polyamide, a polyester, a polyacrylonitrile, a polyacrylate, a polymethacrylate, a polyvinylchloride, a polyvinyledene fluoride, a polytetrafluoroethylene, a polyethylene, a polypropylene and a polycarbonate. In addition, it is conceivable that all polymerizable materials including thermoplastics, epoxies, silicone resins and rubbers could be used as well.

Casting is the preferred method of coating subpad 2 with polishing layer 3 so as to create a seamless polishing layer that is resistant to delamination and impervious to the CMP slurry. Casting involves filling a mold with a hardenable fluid. The hardenable fluid comprises one or more reactive molecules (e.g., a prepolymer, monomer, resin, oligomer, etc.) and optionally one or more reaction initiators (e.g., polymerization initiator, curative, catalyst, hardener, etc.). Alternatively, the reaction may be initiated using light and/or heat. The reactive molecules and reaction initiator may optionally be dissolved in a suitable solvent. A hardenable fluid comprising one or more reactive molecules will often possess the desired flowability and coatability characteristics at the beginning of the reaction, as well as the desired solidity, durability, and seamlessness when fully reacted. The hardenable fluid may optionally comprise one or more non-reactive molecules. For example, a polymer may be suspended or dissolved in a suitable solvent. The casting process results in a seamless polishing layer 3, which may be modified to provide optimum polishing performance. For example, polishing layer 3 may comprise at least one layer of partially fused polymeric particles, or two or more thermoplastic polymers of different melting points. Abrasive particles or fibers may be added to polishing layer 3. In addition, the polishing surface may have micro or macro texturing, grooves, or discontinuities. It may have areas of hard and soft polymer, may have areas of transparent and opaque material, or may have areas of raised and lowered features. It may be formed with grooves (for example, extending in the running direction of the belt or across the width of the belt) to distribute and remove wet slurry and abraded particles generated during the polishing process and to reduce hydroplaning for more consistent contact between the polishing layer and the wafer. If desired slurry can be removed from the grooves using any suitable method, including but not limited to the use of one or more high pressure water jets, rotating fine brushes or hard non-metallic (e.g., ceramic) styli.

The hardenable material is typically injected into the mold, containing subpad 2 and substrate 1, from an open top or through injection points at the bottom and/or sides of the mold. Ideally, a casting method is used wherein the hardenable fluid is applied uniformly to all areas of the subpad 2 and substrate 1. Moreover, the properties (e.g., composition, temperature, etc.) of the hardenable fluid may be modified to ensure that its viscosity does not substantially rise during the period that it is applied to the subpad. For urethanes, the hardenable material will typically set-up into a solid in the hot mold in about 1–20 minutes. The casting is removed from the mold and sometimes placed on a retaining ring (to maintain its form) in an oven and fully cured for a prescribed time (typically 16–24 hours for urethanes) prior to being sent through secondary machining steps such as turning, grinding, grooving, end-point detection punching, and other trimming and laminating steps.

It should be noted that the cast belts of the present invention differ significantly from prior art belts in which the polymer layer is coated onto the substrate by way of adhesion, lamination etc. In contrast to these non-casting methods, casting permits the polishing layer 3 to combine with the substrate 1 and subpad 2 to create a continuous exterior surface of the polishing pad, completely encapsulating and substantially sealing subpad 3 against water penetration. Moreover, by casting directly on the substrate 1 and subpad 2, the polishing layer is resistant to delamination to such a degree that it is not possible to peel away polishing layer 3 from the subpad 2 without destroying the integrity of the belt.

FIG. 1 is a cross-sectional view of a polishing pad in which a polyurethane material was cast directly on subpad 2. Consequently, the polyurethane polishing material 3 that was cast over subpad 2 encapsulates edge region 5 of the subpad, thereby providing an effective, robust, slurry-resistant seal that protects the subpad 2 from degradation by the CMP slurry. Moreover, the robust seal, formed by casting directly on the edge region 5 of the subpad, is able to withstand the bending and stretching associated with CMP polishing, and, in particular, LPT CMP polishing.

Figure 2:
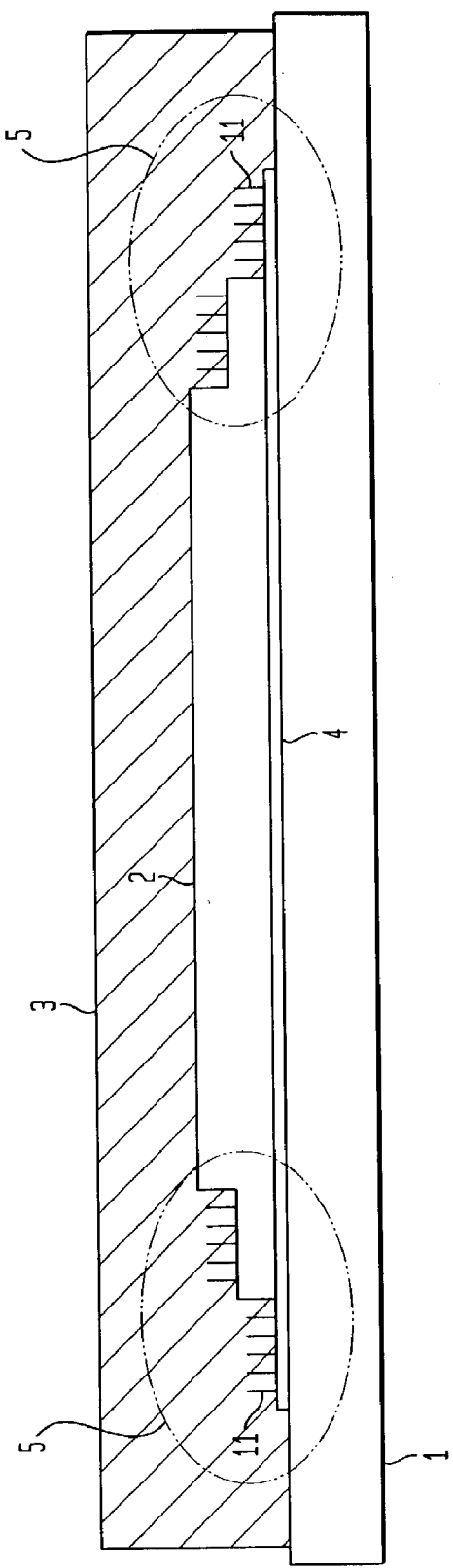
FIG. 2 is a cross sectional view of another embodiment of the present invention in which the edges of the subpad are trimmed so that the thickness of the subpad is reduced at the edges prior to casting the polishing layer directly over the edges of the subpad.

FIG. 2 shows a polishing belt comprising a substrate 1, compressible subpad 2, a polishing layer 3, and an optional adhesive layer 4 which binds the subpad 2 to substrate 1. The edges of the subpad of FIG. 2 have been trimmed so that the thickness of the subpad is reduced around the edges. The edge region 5 of the subpad layer 2 can be modified by, e.g., cutting and removing its constituent material, prior to casting or a pre-modified subpad layer 2 can be obtained from another source and then casted upon with a polymer. Any amount of material may be removed, from substantially none to substantially all. By way of example, at one extreme, the edge region 5 of subpad layer 2 and/or the contact portion of substrate 1 (i.e., where the polishing layer contacts the substrate) may simply be cut, scored and/or pierced. At the other extreme, substantially all of the constituent material may be removed from edge region 5, leaving substantially no constituent material above optional adhesive layer 4. The constituent material may be removed in a substantially random manner, e.g., by using a dremel, providing no consistent shape to edge region 5, or the material may be systematically removed, e.g., by using a computer numerical control router, to provide a continuous, consistent shape to the subpad 2. In one embodiment, the thickness of the edge region 5, extending from 0.100 to 0.5 inches (preferably 0.25 inches) from the edge of the subpad, is reduced in thickness to 0–0.020 inches (preferably 0.005 inches) above the adhesive. Optionally, the adhesive layer 4 and or subpad edge region 5 may contain partially embedded and partially exposed fibers 11 to mechanically lock with said polishing layer 3.

Although FIG. 2 depicts edge region 5 to have substantially flat, orthogonal surfaces, no particular geometry of the edge region 5 must be achieved in order to improve the sealing performance of the encapsulated belt. In fact, because the method of creating the edge region 5 typically involves cutting, scraping, and peeling of the subpad layer, precise geometries are potentially difficult to achieve. Moreover, desirable adhesion and penetration of the polymer into the edge region 3 of subpad layer 2 may, in fact, be aided by an uneven surface texture of edge region 5.

The reduction in thickness of the subpad edges facilitates the partial or complete penetration of the polyurethane into the subpad. The partial or complete saturation of the edges of the subpad with the polishing layer results in the complete encapsulation of the subpad edges by the polyurethane which substantially seals the subpad layer 2 against water and slurry penetration. The subpad edges are not exposed to the CMP slurry, and so cannot be attacked or degraded by CMP slurry.

FIG. 3 depicts another cross-sectional embodiment of the belt of the present invention. In this Figure, the substrate 1, the subpad layer 2, the polishing layer 3, and the optional adhesive layer 4 are as previously described, with the exception that the subpad layer 2 has an additional functional feature to promote the formation of a moisture-tight or watertight seal when a polymer is cast over the subpad layer 2. Specifically, edge region 5 of the subpad layer 2 has a sloped structure, such that the thickness of edge region 5 decreases gradually from the interior region 7 outward to the perimeter edge. The increase in surface area of the sloped edge of subpad layer 2 in FIG. 3, as compared to a straight-edged subpad, provides a wider area of the subpad edge to which the polishing layer can bond during casting. Consequently, a stronger and more robust seal is formed between the polishing layer and subpad edge which provides greater protection against the CMP polishing slurry. Although FIG. 3 depicts a subpad edge with a sloped structure, other shapes of edge region 5 can be used to increase the subpad edge surface area and improve the seal between the edge of the subpad and the polishing layer.

As in the previous embodiments, the polishing layer 3 combines with subpad layer 2 to comprise a continuous exterior surface of the encapsulated belt which completely encapsulates and substantially seals the subpad edge region 5 against water penetration, preventing CMP slurry from contacting the subpad. The robust seal of the present invention protects the subpad edge region 5 from water and slurry penetration even in if the polishing layer 3 does not bond particularly well to the substrate 1. Consequently, the subpad cannot be attacked or degraded by CMP slurry.

Another embodiment of the encapsulated belts is shown, in cross section, in FIG. 4. In this embodiment, the substrate 1, the subpad layer 2, the polishing layer 3, and the optional adhesive layer 4 are as previously described, with the exception that the subpad layer 2 has an additional functional feature to promote the formation of a watertight seal when the polymer mixture is cast over subpad layer 2. Specifically, the edge region 5 of the subpad layer 2 is coated with an adhesive 12 or sealant prior to casting the polymer mixture over the subpad layer 2. Any suitable adhesive may be used, including, but not limited to, polyurethane based adhesives, acrylic based adhesives, methacrylic based adhesives, urethane based adhesives, cyanoacrylate based adhesives, vinylic based adhesives, epoxy based adhesives, styrenic based adhesives and rubber based adhesives, with polyurethane based and acrylic based adhesives being preferred. By way of example, suitable polyurethane adhesives include D2596H Adhesive and D2597 Crosslinker, available from DELA, Inc. (Ward Hill, Mass.). Chemlok® 213, available from Lord® Corporation (Cary, N.C.) is an example of a suitable acrylic adhesive. In addition to, or in lieu of, the aforementioned adhesives, the subpad layer 2 may be coated by one or more of a hot melt, contact cement, anaerobic compound, UV curative, emulsions (e.g., white glues), sealants (e.g., silicones, acrylics, urethanes, butyl and polysulfides), modified phenolic compounds, plastisols (e.g., modified PVC dispersions), polyvinyl acetates, and specialty adhesives (e.g., pressure sensitive, cohesive self-seal, heat seal, foam and fabric sealants). The adhesive or bonding compound may be applied in a suitable manner—e.g., by brushing, dipping, or spraying. The adhesive preferably penetrates into the subpad layer. Although FIG. 4 illustrates a subpad having vertical edge perpendicular to the horizontal surfaces of the subpad layer 2, any suitable edge region 5 geometry may be used (e.g., as described above in relation to FIGS. 2 and 3).

As in the previous embodiments, polishing layer 3 combines with subpad layer 2 to comprise a continuous exterior surface of the belt, which completely encapsulates and substantially seals the edges of the subpad against water penetration, preventing CMP slurry from contacting the subpad and causing degradation. The robust seal of the present invention protects the subpad edge region 5 from water and slurry penetration even in if the polishing layer 3 does not bond particularly well to the substrate 1. Consequently, the subpad cannot be attacked or degraded by CMP slurry.

The methods previously described can be used to prepare the belt illustrated in FIG. 4. For example, edge region 5 of the subpad layer 2 can be modified by, e.g., cutting and removing constituent material, and then coating it with adhesive 12 prior to casting. Alternatively, a pre-modified subpad layer 2 can be obtained from another source, and then coated with adhesive 12 prior to casting.

Figure 5:
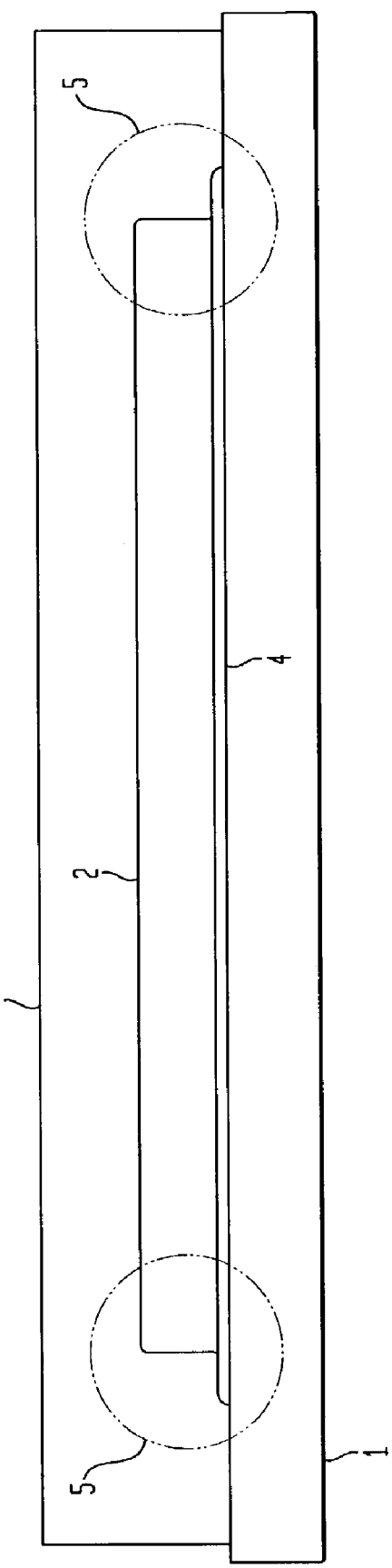
FIG. 5 is a cross sectional view of another embodiment of the present invention in which the edges of the subpad have been heat-sealed prior to casting the polishing layer directly over the edges of the subpad.

FIG. 5 depicts, in cross section, another embodiment of the present invention. In this embodiment, the substrate 1, the subpad layer 2, the polishing layer 3, and the optional adhesive layer 4 are as previously described, with the exception that the subpad layer 2 has an additional functional feature to promote the formation of a watertight seal when the polishing layer 3 is cast over subpad layer 2. Specifically, each edge region 5 of the subpad layer is heat sealed or pressure embossed to promote the formation of a watertight seal when the polymer mixture is cast onto the subpad layer 2. The edge region 5 of the subpad layer 2 can be heat sealed prior to casting, or a pre-modified (i.e., already heat-sealed) subpad layer 2 can be obtained from another source and then cast over with a polymer. As depicted in FIG. 5, the seal may be formed in edge region 5 directly on the perimeter edge of subpad layer 2. Alternatively, the seal may be placed in edge region 5 inward from the perimeter edge of subpad layer 2 by applying a custom heat sealer or rotary heat sealer to the subpad at a suitable distance from the edge region. By way of example, a seal having a width of about 0.05–0.5 inches (preferably 0.25 inches) could be placed about 0.1 to 1 inch inward from the perimeter edge of the subpad layer 2.

As in the previous embodiments, the polishing layer 3 combines with the subpad layer 2 to comprise a continuous exterior surface of the encapsulated belt, which completely encapsulates and substantially seals the subpad edge against water penetration, preventing CMP slurry from contacting the subpad and degrading the belt. The robust seal of the present invention protects the subpad edge region 5 from water and slurry penetration even in if the polishing layer 3 does not bond particularly well to the substrate 1. Consequently, the subpad cannot be attacked or degraded by CMP slurry.

Figure 6A:
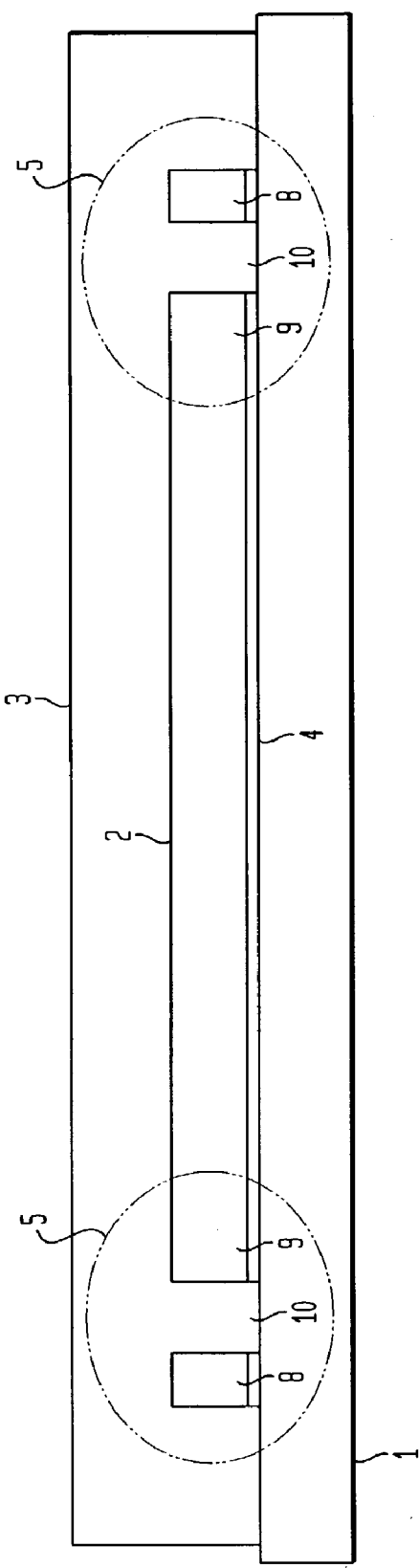
FIG. 6A is a cross sectional view of another embodiment of the present invention containing a channel adjacent to the edge region of the subpad wherein the subpad material is completely removed from the channel to form two subpad regions which protect the subpad against chemical mechanical slurry.

Another embodiment of the belt is shown, in cross section, in FIG. 6A. As in the previous embodiments, the substrate 1, the subpad layer 2, the polishing layer 3, and the optional adhesive layer 4 are as previously described, with the exception that the subpad layer 2 has an additional functional feature to promote the formation of a watertight seal when a polymer mixture is cast over the subpad layer 2. Specifically, each edge region 5 of the subpad layer 2 comprises a channel 10 running adjacent to the perimeter edge of subpad layer 2, wherein the subpad material completely removed from the channel 10 to form two subpad regions. The outer subpad region 8 borders the inner subpad region 9 at a distance. The outer region 8 forms a barrier for the inner subpad region 9 and protects the inner subpad region 9, as well as the entire subpad layer 2, from any CMP slurry that penetrates the outer polishing layer 3 that is cast over the subpad 2. For example, the subpad region 8, which is encapsulated by polishing layer 3, would serve as a first defense against the slurry. Even if some of the slurry is able to penetrate the outer subpad region 8 because of an imperfection in the polishing layer encapsulating the outer subpad region 8, the slurry is not likely to penetrate the inner subpad region 9, even if the polishing layer surrounding subpad region 9 contains imperfections, since the imperfections in the polishing layer encapsulating inner subpad region 9 are not likely to be positioned parallel to the imperfection in the polishing layer encapsulating outer subpad region 8. In addition, if the slurry does pass the outer subpad region 8, the driving force of the slurry as it approaches inner subpad region 9 will be much lower.

The channel can have any suitable dimensions, e.g., width and depth, and can be any suitable shape. For example, although the cross section of the channel in FIG. 6A is rectangular (i.e., has smooth orthogonal surfaces), any cross sectional shape may be used, such as, for example, circular, pyramidal (vertical or inverted), "L" shaped, inverted "T" shaped, etc.

Figure 6B:
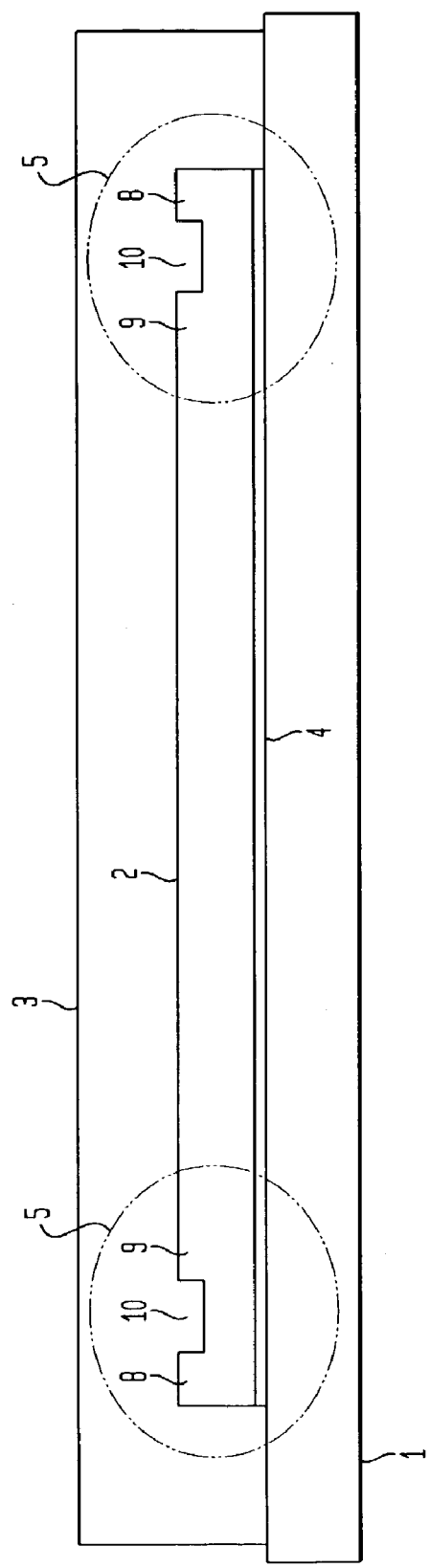
FIG. 6B is a cross sectional view of another embodiment of the present invention in which the subpad material is partially removed from the channel.

In an alternative embodiment 6B, each edge region 5 of the subpad layer 2 comprises a channel 10 running adjacent to the perimeter edge of subpad layer 2, wherein the subpad material is partially removed from the channel 10 to form two subpad regions which appear as inner subpad region 9 and outer subpad region 8. The subpad material of the channel 10 is thinner than inner subpad region 9 and outer subpad region 8. As discussed above with respect to FIG. 6A, the channel of FIG. 6B can have any suitable dimension (e.g., width and depth), can be any suitable shape, and can extend any suitable distance from the perimeter edge of inner subpad region 2. In yet another alternative embodiment a separate strip of material (i.e., a material other than the subpad material or a different subpad material) is placed adjacent the subpad to create a second barrier.

It is preferred that each channel be of such dimensions that it creates an effective barrier against slurry seeping into subpad layer 2, without interfering with the cushioning performance of subpad layer 2 in the polishing region of the encapsulated belt. By way of example, it has been found that a channel located about 0.1 to 1 inch (preferably 0.25 inches) inward from the perimeter edge of the subpad layer 2, having a width of about 0.05 to 0.5 inches (preferably 0.25 inches), and a depth that substantially reaches down to the substrate 1 (i.e., substantially all of the subpad's constituent material and adhesive layer 4 are removed from the channel), provides the preferred characteristics. However, channels do not necessarily need to go substantially to the substrate to be effective. It is possible to create an effective channel by only removing a portion of the substrate only, or all of subpad material but not the adhesive, or alternatively by removing all of the subpad material and a portion of the adhesive.

The channel can be created in any suitable manner. For example, two incisions can be made into the edge region 5 about 0.1 to 1 inch (preferably 0.25 inches) inward from the perimeter edge of the subpad layer 2, having a width of about 0.05 to 0.5 inches (preferably 0.25 inches) and a depth that substantially or partially reaches down to the substrate 1. Furthermore, the channel can be cut into each edge region 5 of the subpad layer 2 prior to casting, or a pre-modified subpad layer 2 (i.e., already comprising channels in each edge region 5) can be obtained from another source and then cast over with a polymer mixture.

As in the previous embodiments, the polishing layer 3 combines with subpad layer 2 to comprise a continuous exterior surface of the encapsulated belt, which completely encapsulates and substantially seals the subpad edges against water or slurry penetration, preventing CMP slurry from contacting the subpad and degrading the belt. As previously stated, the subpad layer 2 may comprise any of the previously-described additional functional features to promote the formation of a watertight seal when the polishing layer 3 is cast upon the subpad layer 2.

It has been found that when a polymer is cast directly onto subpad layer 2, as previously described, two problems may potentially arise. First, the cast polymer mixture may penetrate into the subpart layer 2 to varying degrees at different subpad locations. This nonuniform penetration can cause the polishing layer 3 to have nonuniform hardness properties. Second, air bubbles can be trapped between the subpad surface and the cast polymer mixture or in the polymer layer itself, leading to nonuniform performances of the polishing layer 3.

Figure 7:
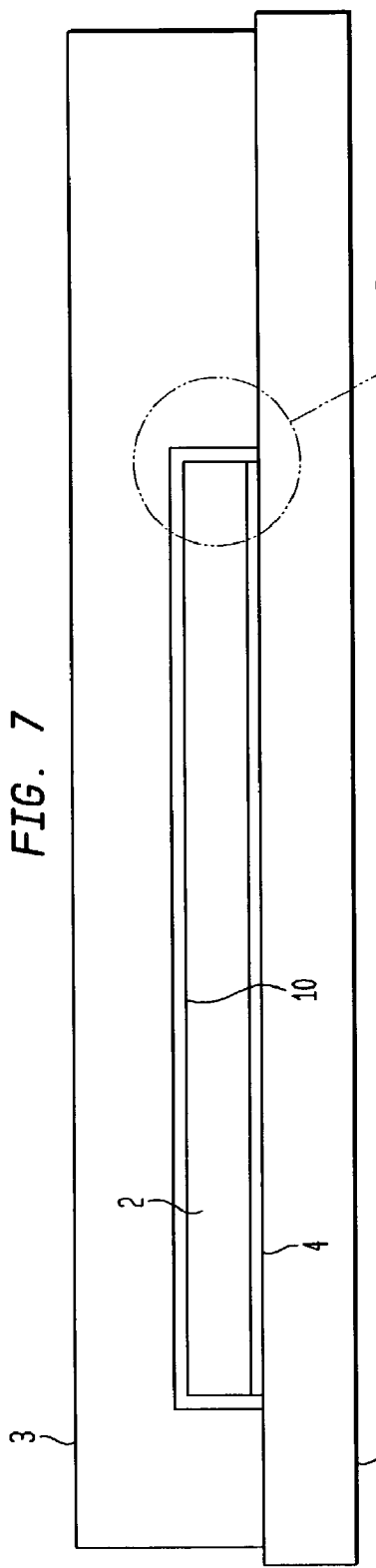
FIG. 7 is a cross sectional view of another embodiment of the present invention comprising a subpad edge region which has been coated with a barrier agent to facilitate uniform distribution of the polishing layer and to prevent air bubbles from being trapped between the subpad surface and the polishing layer.

These problems can be substantially overcome by including a barrier agent 10 on the surface and edges of the subpad layer 2. FIG. 7 illustrates this embodiment. In FIG. 7, the substrate 1, the subpad layer 2, the polishing layer 3, and the optional adhesive layer 4 are as previously described. The belt of FIG. 7, however, additionally comprises element 10, a barrier agent disposed on the outer surface of the subpad layer 2, including the edges of the subpad, which promotes the uniform distribution of the polishing layer 3 when cast thereon. The barrier agent 10 typically comprises a material whose viscosity increases after it is applied to the subpad 2. However, any material having the following properties, when applied to the subpad 2, may be used as barrier agent 10: (a) the barrier agent should adhere strongly to both subpad 2 and polishing layer 3; (b) it should substantially prevent polishing layer 3 from penetrating past it into the subpad; and (c) it should not substantially alter the compressibility of the subpad.

Although other modes of adhesion are possible, it is preferred that barrier agent 10 be capable of adhering to subpad 2 and to polishing layer 3 via chemical adhesive forces and/or mechanical locking interactions, in order to promote strong adhesion between the elements of the polishing pad. The barrier agent's chemical adhesive forces will vary depending on the composition of subpad 2 and polishing layer 3. Materials capable of strong adhesion to the various components of subpad 2 and polishing layer 3 are well known to those of skill in the art and may include a polyurethane, acrylic, methacrylic, urethane, cyanoacrylate, vinylic, epoxy, or styrenic based adhesive. Also suitable are hot melts, contact cements, anaerobics (acrylics), UV curables, emulsions (white glues), sealants (silicones, acrylics, urethanes, butyl and polysulfides, etc.), modified phenolics, plastisols (modified PVC dispersions), rubber adhesives (solution, latexes), polyvinyl acetates (emulsions), specialty adhesives (pressure sensitive, cohesive self-seal, heat seal, foam & fabric, etc.), and labeling adhesives (resin adhesives, latex adhesives, etc.). Polyurethane and acrylic adhesives are preferred.

In a preferred embodiment, barrier agent 10 comprises a material that is fluid enough to fill the lowermost textured portions of subpad 2 when it is applied, but viscous enough to adopt the texture of subpad 2. That combination of properties can be found in materials, such as hardenable fluids, which can be applied at relatively low viscosities, but which increase in viscosity rapidly after application. Adhesives that increase in viscosity after application, such as adhesives applied in volatile solvents, are suitably used as barrier agent 10. Examples include polyurethane adhesives, such as D2596H Adhesive and D2597 Crosslinker, available from DELA, Inc. (Ward Hill, Mass.), and acrylic adhesives, such as Chemlok® 213, available from Lord® Corporation (Cary, N.C.). Alternatively or additionally, the surface of barrier agent 10 may be modified to add texture.

Another way to maximize chemical adhesion is to employ a barrier agent 10 that can chemically bond to polishing layer 3. For example, if both barrier agent 10 and the hardenable fluid that will create polishing layer 3 initially comprise reactive molecules, then cross-reaction between the elements will be possible if the hardenable fluid is coated onto barrier agent 10 before the latter has fully reacted.

The barrier agent 10 can be applied to the edges of the subpad layer 2 using any suitable method, such as brushing, blowing, dipping, spraying, knifing, and transfer coating. Any suitable amount of barrier agent may be used. In addition, once the barrier agent is applied to the subpad, the subpad can be subjected to secondary processing such as sanding, embossing, and maching to achieve desired texture, grooves or patterns on the subpad.

The method previously described can be used to prepare the encapsulated belt illustrated in FIG. 7. For example, subpad layer 2 can be coated with barrier agent 10 prior to casting. The subpad layer 2 may include one or more additional functional features to promote the formation of a watertight seal the polishing layer 3. For example, the edge region 5 of the subpad layer 2 and/or the contact portion of substrate may be modified, as previously described (e.g., by cutting, scoring, piercing, channeling the edge region of the subpad layer), either before or after subpad layer 2 is coated with barrier agent 10. Alternatively, a pre-modified subpad layer 2 containing the barrier agent 10 may be obtained and cast upon.

Figure 8:
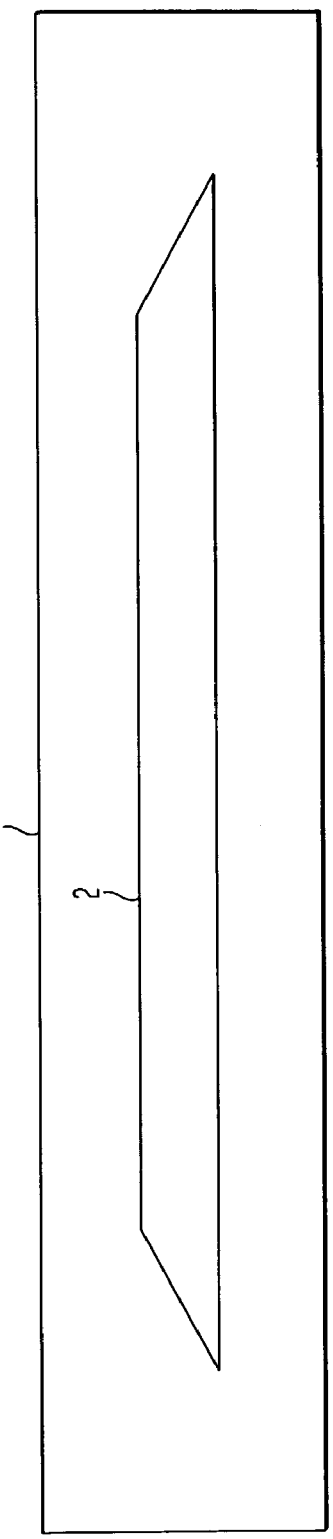
FIG. 8 is a cross sectional view of another embodiment of the present invention in which the polishing layer 3 encapsulates the subpad layer 2 on all sides, substantially sealing the subpad layer against chemical mechanical slurry penetration.

FIG. 8 illustrates, in cross section, another embodiment of the encapsulated belt and encapsulated pad. In this embodiment, a substrate element (element 1 in previous Figures) does not combine with the polishing layer 3 to comprise a continuous exterior surface of the encapsulated belt which substantially seals the subpad layer 2 against water penetration. Instead, the polishing layer 3 alone encapsulates the subpad layer 2, substantially sealing subpad layer 2 against water penetration. As in the previous embodiments, by encapsulating the subpad, including the edges of the subpad, the subpad is not exposed to the CMP slurry, and so, cannot be attacked or degraded by CMP slurry.

The methods previously described can be used to prepare the encapsulated belt illustrated in FIG. 8 with the following exception. Subpad layer 2 is not placed onto substrate 1 prior to casting a polymer mixture thereover. Instead, either of two methods may be used. In one method, a first polymer mixture may be cast in a mold to form a first layer. Then, preferably before the first layer cures, subpad layer 2 is placed onto the first layer. Finally, preferably before the first layer cures, a second polymer mixture (which may be identical to the first) is cast over the subpad layer 2, being careful to completely cover all exposed surfaces of subpad layer 2. The first and second polymer mixtures combine to completely encapsulate and substantially seal the subpad layer 2 against water penetration. As an alternative method, a polymer mixture may be cast to cover all surfaces of subpad layer 2, to completely encapsulate and substantially seal the subpad layer 2 against water penetration. The encapsulated subpad layer 2 may then be optionally attached to a substrate 1, for example using an adhesive layer 4.

In addition to the above-referenced embodiments, the present invention relates to sealing the edge of one or more inner apertures in the subpad layer. For example, a belt may contain a polishing layer, subpad layer and substrate layer with adjacent overlapping apertures for purposes of endpoint detection. In other words, the aperture runs from the polishing surface, through the subpad and through the substrate on the opposite side of the polishing surface to allow a light beam to pass from a monitor located below the substrate to the wafer positioned above the polishing surface. Consequently, the periphery of the aperture in the subpad is exposed to the chemical slurry or water that is applied to the surface of the pad. The chemical slurry can enter the subpad by way of the peripheral edge of the aperture and degrade the belt just as if it had entered the outer edge regions of the subpad. The present invention overcomes this problem in the same manner as discussed above with respect to the outer subpad edge—i.e., by cutting, scoring, piercing, channeling, heat-sealing, applying adhesives and casting over the peripheral edges of the subpad aperture.

While the preferred embodiments of the invention shown and described above have proven useful in providing a robust, effective seal for the edges of a subpad, further modifications of the present invention herein disclosed will occur to persons skilled in the art to which the invention pertains, and all such modifications are deemed to be within the scope and spirit of the present invention defined by the applicable claims.

What is claimed is:

1. A belt or pad for polishing or planarizing a workpiece, comprising a substrate, a seamless polishing layer, and at least one subpad layer placed between said substrate and said polishing layer, wherein said polishing layer is cast over said subpad and substrate so as to encapsulate the subpad layer and substantially prevent moisture penetration into the subpad layer.

2. The belt or pad of claim 1, wherein said subpad layer comprises a compressible non-woven material.

3. The belt or pad of claim 2, wherein said non-woven material comprises at least one of a polyester, polyamide, polyurethane, polyolefin, fluoropolymer, cotton, or wool.

4. The belt or pad of claim 1, wherein said substrate comprises stainless steel, plastic, or an elastomer.

5. The belt or pad of claim 1, wherein said subpad layer is bonded to said substrate.

6. The belt or pad of claim 1, wherein said subpad layer is bonded to said substrate by way of a pressure sensitive adhesive.

7. The belt or pad of claim 1, wherein said polishing layer comprises a polymerizable material.

8. The belt or pad of claim 7, wherein said polymerizable material includes at least one of a polyurethane, polyamide, a polyester, a polyacrylonitrile, a polyacrylate, a polymethacrylate, a polyvinylchloride, a polyvinyledene fluoride, a polytetrafluoroethylene, a polyethylene, a polypropylene, a polycarbonate, a thermoplastic, an epoxy, a silicone resin and a natural or synthetic rubber.

9. The belt or pad of claim 1, wherein said subpad contains an interior region and at least one edge region disposed at a perimeter edge of the subpad layer, said interior region of the subpad layer being of substantially uniform thickness, and said edge region of said subpad layer being thinner than the interior region.

10. The belt or pad of claim 1, wherein said subpad contains an interior region and at least one edge region disposed at a perimeter edge of the subpad layer, said edge region of said subpad layer is sloped such that the thickness of said edge region decreases gradually from said interior region outward.

11. The belt or pad of claim 1, wherein said subpad contains an interior region and at least one edge region disposed at a perimeter edge of said subpad layer, wherein said edge region of said subpad layer is coated with an adhesive.

12. The belt or pad of claim 11, wherein said adhesive comprises a polyurethane-base adhesive which penetrates into said subpad layer.

13. The belt or pad of claim 1, wherein said subpad contains an interior region and at least one edge region disposed at a perimeter edge of said subpad layer, said edge region being heat-sealed.

14. The belt or pad of claim 1, wherein said channel comprises a subpad material, said subpad material being less thick than the subpad material on either side of said channel.

15. The belt or pad of claim 1, wherein said subpad contains an interior region and at least one edge region disposed at a perimeter edge of said subpad layer, wherein at least said edge region of said subpad layer is coated with a barrier agent to facilitate uniform penetration of said polishing layer.

16. The belt or pad of claim 15, wherein said barrier agent consists of at least one of a polyurethane, an acrylic, a methacrylic, a urethane, a cyanoacrylate, a vinylic, an epoxy, or styrenic base adhesive.

17. The belt or pad of claim 15, wherein said barrier agent consists of at least one of a hot melt, contact cement, anaerobic acrylic, UV curable compound, emulsion, sealant, modified phenolic compound, plastisol, rubber adhesive, polyvinyl acetate, specialty adhesive or labeling adhesive.

18. A belt or pad for polishing or planarizing a workpiece, comprising a seamless polishing layer and at least one subpad layer having an interior region and at least one edge region disposed at a perimeter edge of said subpad layer, said polishing layer is cast over said subpad to encapsulate said subpad, wherein said edge region of said subpad layer comprises one or more functional feature that promotes the formation of a moisture-resistant seal.

19. The belt or pad of claim 18, wherein said subpad layer comprises a compressible non-woven material.

20. The belt or pad of claim 19, wherein said non-woven material comprises at least one of a polyester, polyamide, polyurethane, polyolefin, fluoropolymer, cotton, or wool.

21. The belt or pad of claim 18, wherein said polymerizable material includes at least one of a polyurethane, polyamide, a polyester, a polyacrylonitrile, a polyacrylate, a polymethacrylate, a polyvinylchloride, a polyvinyledene fluoride, a polytetrafluoroethylene, a polyethylene, a polypropylene, a polycarbonate, a thermoplastic, an epoxy, a silicone resin and a natural or synthetic rubber.

22. The belt or pad of claim 18, wherein said interior region of said subpad layer is of substantially uniform thickness, and said edge region of said subpad layer is less thick than said interior region.

23. The belt or pad of claim 18, wherein said edge region of the subpad layer is sloped such that the thicknesses of said edge region decrease gradually from said interior region outward.

24. The belt or pad of claim 18, wherein said edge region of said subpad layer is coated with an adhesive.

25. The belt or pad of claim 24, wherein said adhesive comprises a polyurethane-base adhesive which penetrates into said subpad layer.

26. The belt or pad of claim 18, said edge region of said subpad layer being heat-sealed.

27. The belt or pad of claim 1, wherein said channel comprises a subpad material, said subpad material being less thick than the subpad material on either side of said channel.

28. The belt or pad of claim 19, wherein at least said edge region of said subpad layer is coated with a barrier agent to facilitate uniform penetration by said polishing layer.

29. The belt or pad of claim 28, wherein said barrier agent consists of at least one of a polyurethane, an acrylic, a methacrylic, a urethane, a cyanoacrylate, a vinylic, an epoxy, or styrenic base adhesive.

30. The belt or pad of claim 28, wherein said barrier agent consists of at least one of a hot melt, contact cement, anaerobic acrylic, UV curable compound, emulsion, sealant, modified phenolic compound, plastisol, rubber adhesive, polyvinyl acetate, specialty adhesive or labeling adhesive.

31. A belt or pad for chemical mechanical polishing of an electronic workpiece, comprising a robust seal between a polishing layer and at least one compressible subpad layer edge region disposed at a perimeter edge of a compressible subpad, wherein said polishing layer is cast over said subpad to encapsulate said subpad and seal said subpad layer edge region against chemical mechanical slurry penetration.

32. The belt or pad of claim 31, wherein said polymerizable material includes at least one of a polyurethane, polyamide, a polyester, a polyacrylonitrile, a polyacrylate, a polymethacrylate, a polyvinylchloride, a polyvinyledene fluoride, a polytetrafluoroethylene, a polyethylene, a polypropylene, a polycarbonate, a thermoplastic, an epoxy, a silicone resin and a natural or synthetic rubber.

33. The belt or pad of claim 31, wherein said subpad layer comprises a compressible non-woven material.

34. The belt or pad of claim 33, wherein said non-woven material comprises at least one of a polyester, polyamide, polyurethane, polyolefin, fluoropolymer, cotton, or wool.

35. The belt or pad of claim 31, wherein said edge region of said subpad layer is thinner than the rest of said subpad layer.

36. The belt or pad of claim 31, wherein said subpad contains an interior region, said edge region of said subpad layer is sloped such that the thicknesses of said edge region decreases gradually from said interior region outward.

37. The belt or pad of claim 31, wherein said edge region is coated with an adhesive.

38. The belt or pad of claim 37, wherein said adhesive comprises a polyurethane-base adhesive which penetrates said subpad layer.

39. The belt or pad of claim 31, wherein said edge region is heat-sealed prior to casting said polishing layer.

40. The belt or pad of claim 31, wherein said channel comprises a subpad material, said subpad material being less thick than the subpad material on either side of said channel.

41. The belt or pad of claim 31, wherein said channel comprises different materials on each side of the channel.

42. The belt or pad of claim 31, wherein at least said edge region of the subpad layer is coated with a barrier agent to facilitate uniform penetration by said polishing layer.

43. The belt or pad of claim 42, wherein said barrier agent consists of at least one of a polyurethane, an acrylic, a methacrylic, a urethane, a cyanoacrylate, a vinylic, an epoxy, or styrenic base adhesive.

44. The belt or pad of claim 42, wherein said barrier agent consists of at least one of a hot melt, contact cement, anaerobic acrylic, UV curable compound, emulsion, sealant, modified phenolic compound, plastisol, rubber adhesive, polyvinyl acetate, specialty adhesive or labeling adhesive.

45. The belt or pad of claim 31, comprising a substrate, wherein said polishing layer is cast over said subpad to combine with said substrate to encapsulate and seal said subpad layer.

46. The belt or pad of claim 45, wherein said substrate comprises stainless steel, plastic, or an elastomer.

47. The belt or pad of claim 45, wherein said edge region of said subpad layer is less thick than the rest of said subpad layer.

48. The belt or pad of claim 45, wherein said subpad contains an interior region, said edge region of said subpad layer is sloped such that the thicknesses of said edge region decreases gradually from said interior region outward.

49. The belt or pad of claim 45, wherein said edge region is coated with an adhesive.

50. The belt or pad of claim 45, wherein said edge region of said subpad layer is heat-sealed prior to casting said polishing layer.

51. The belt or pad of claim 45, comprising a channel adjacent to said perimeter edge of said subpad layer.

52. The belt or pad of claim 51, wherein said channel comprises a subpad material, said subpad material being less thick than the subpad material on either side of said channel.

53. The belt or pad of claim 51, wherein said channel comprises different materials on each side of the channel.

54. The pad or belt of claim 45, wherein at least said edge region of the subpad layer is coated with a barrier agent to facilitate uniform penetration by said polishing layer.

* * * * *

UNITED STATES PATENT AND TRADEMARK OFFICE
CERTIFICATE OF CORRECTION

PATENT NO. : 7,201,647 B2  Page 1 of 1
APPLICATION NO. : 10/273194
DATED : April 10, 2007
INVENTOR(S) : Lombardo et al.

It is certified that error appears in the above-identified patent and that said Letters Patent is hereby corrected as shown below:

Col. 14 line 39
In claim 1, following "A belt or pad for polishing or planarizing a workpiece, comprising a substrate, a seamless polishing layer, and at least one subpad layer placed between said substrate and said polishing layer, wherein said" insert -- subpad contains an interior region and at least one edge region disposed at a perimeter edge of said subpad layer, said edge region comprises a channel running adjacent to said perimeter edge of said subpad layer, and wherein said...--

Col. 15 line 47
In claim 19, following "A belt or pad for polishing or planarizing a workpiece, comprising a seamless polishing layer" insert --made of polymerizable material-- and following "and at least one subpad layer having an interior region and at least one edge region disposed at a perimeter edge of said subpad layer" insert --and a channel adjacent said perimeter edge,...--

Col. 16 line 39
In claim 34, following "A belt or pad for chemical mechanical polishing of an electronic workpiece, comprising a robust seal between a polishing layer" insert --made of a polymerizable material-- and following "and at least one compressible subpad layer edge region disposed at a perimeter edge of a compressible subpad" insert --and a channel running substantially adjacent to said perimeter edge,...--

Signed and Sealed this

Second Day of October, 2007

JON W. DUDAS
*Director of the United States Patent and Trademark Office*